United States Patent [19]

Voegtly et al.

[11] Patent Number: 5,121,413
[45] Date of Patent: Jun. 9, 1992

[54] DIGITAL PULSE PROCESSOR FOR DETERMINING LEADING AND TRAILING TIME-OF-ARRIVAL

[75] Inventors: Carl H. Voegtly, Scottsdale; James T. Shaneyfelt, Gilbert, both of Ariz.

[73] Assignee: Motorola, Inc., Schaumburg, Ill.

[21] Appl. No.: 489,302

[22] Filed: Mar. 5, 1990

[51] Int. Cl.⁵ .......................................... H04L 27/06
[52] U.S. Cl. ..................... 375/95; 375/102; 375/99; 328/108; 307/518
[58] Field of Search ........... 375/95, 99, 102, 94; 328/108, 109, 115, 135, 150, 111; 307/510, 518, 528

[56] References Cited

U.S. PATENT DOCUMENTS

| | | | |
|---|---|---|---|
| 3,611,298 | 10/1971 | Jacobson | 375/95 X |
| 3,646,445 | 2/1972 | Reindl | 375/95 X |
| 3,921,076 | 11/1975 | Currie | 375/95 X |
| 4,507,795 | 3/1985 | Wagner | 375/95 |
| 4,972,441 | 11/1990 | Roberts et al. | 375/95 |

*Primary Examiner*—Douglas W. Olms
*Assistant Examiner*—Ralph Smith
*Attorney, Agent, or Firm*—Frank J. Bogacz; Jordan C. Powell

[57] ABSTRACT

A Digital Pulse Processor (DPP) designed to accept pulsed inputs and produce digital pulse descriptor word (PDW) outputs accepts pulsed signals from three adjacent channelized inputs. The DPP then derives a measurement of pulse amplitude from the peak value in the center frequency channel. The relative peak amplitudes between channels are used to establish aa fine frequency offset. The fine frequency offset is used in conjunction with coarse frequency inputs to compute a pulse frequency estimate. An internal counter generates a time reference for time of arrival (TOA) and pulse width measurements. The TOA and pulse width measurements are based on calculations to establish three dB points on the leading and trailing edges of the pulse. This pulse characterization information is produced in real time at the optimum signal-to-noise ratio, and is independent of incoming amplitude, rise/fall time, and pulse width. The pulse characterization information is accumulated and formatted into four 16-bit PDWs for output during the subsequent pulse processing period A RESET output is generated to mark the end of the pulse processing period, both for normal operation and for cases where a pulse is expected (based on normal input control) but is not detected.

14 Claims, 3 Drawing Sheets

DIGITAL PULSE PROCESSOR FOR DETERMINING LEADING AND TRAILING TIME-OF-ARRIVAL

BACKGROUND OF THE INVENTION

This invention relates, in general, to circuits detecting pulse time of arrival (TOA) for radio frequency pulses, and more specifically, to processors for detecting real time TOA in variable and dense signal environments.

Pulse TOA has typically been measured against some fixed amplitude threshold. This method causes a variation to be perceived in the TOA due to the relative amplitude of the incoming pulse. Refinement to eliminate such variations was accomplished by the circuit found in U.S. Pat. No. 4,507,795, issued Mar. 26, 1985 to Carl Wagner and assigned to the same assignee as the present invention. The '795 patent includes a fixed delay and a threshold comparison channel to determine the leading and trailing edge TOA of the pulse. The '795 patent, in its preferred embodiment, shifts the comparison portion of the split signal down 3 dB, or another desired value from the pulse peak amplitude, and determines the leading edge TOA from the cross-over point of the threshold (non-delayed) signal with respect to the delayed signal.

The '795 method requires that the rise time of the pulse be short compared to the length of the delay line selected. The range of the pulse-widths need to be greater than the delay line selected. It is not practical to select a delay line length that will allow accurate TOA measurements for a range of pulse-widths and rise times occurring simultaneously over several orders of magnitude. Classically, the problem has been resolved by using a wave-form recording technique to record the entire pulse. The actual TOA value is then extracted through computer processing at later times. Real time determination is not possible through such a technique.

SUMMARY OF THE INVENTION

Accordingly, it is an object of the present invention to provide a method and apparatus to determine TOA of variable and dense signal environments in real time.

The description of this invention is based on its application to a channelized receiver, for which the invention was originally conceived. A channelized receiver is a radio frequency receiver composed of a number of uniformly spaced contiguous narrowband receivers which cover the total receiver bandwidth of interest. This technique is utilized in order to improve the predetection signal-to-noise ratio of the incoming signal when the center frequency of the signal has a very large uncertainty with respect to the actual signal's bandwidth. Coarse frequency for a given input signal is determined by observing which channel reports the largest amplitude. The frequency resolution of the coarse frequency is directly related to the actual bandwidth of the individual channels. Fine frequency is determined by making a measurement of the frequency, either by counting the frequency or employing a discriminator method. The discriminator method determines the location of the input signal within a specific channel. An adjacent channel frequency discriminator method is described in the preferred embodiment to the present invention. Each channel of a channelized receiver would have a detector and a Digital Pulse Processor (DPP) as described in the following paragraphs. The invention is not limited to the channelized receiver but could easily be adapted to a conventional narrowband or super heterodyne tunable receiver.

The relative peak amplitudes between channels are used to establish a fine frequency offset. The fine frequency offset is used in conjunction with coarse frequency inputs to compute a pulse frequency estimate. An internal counter generates a time reference for time-of-arrival (TOA) and pulse width measurements. The TOA and pulse width measurements are based on calculations to establish three dB (decibel) points on the leading and trailing edges of the pulse. The pulse characterization information is accumulated and formatted into four 16-bit PDWs (pulse description words) for output during the subsequent pulse processing period. A RESET output is generated to mark the end of the pulse processing period, both for normal operation and for cases where a pulse is expected (based on normal input control) but is not detected.

The above and other objects, features, and advantages of the present invention will be better understood from the following detailed description taken in conjunction with the accompanying drawings.

DETAILED DESCRIPTION OF THE INVENTION

"Video," as used throughout this description, refers to a signal which is already detected or demodulated. The term is not related to visual signals.

Figure 1:
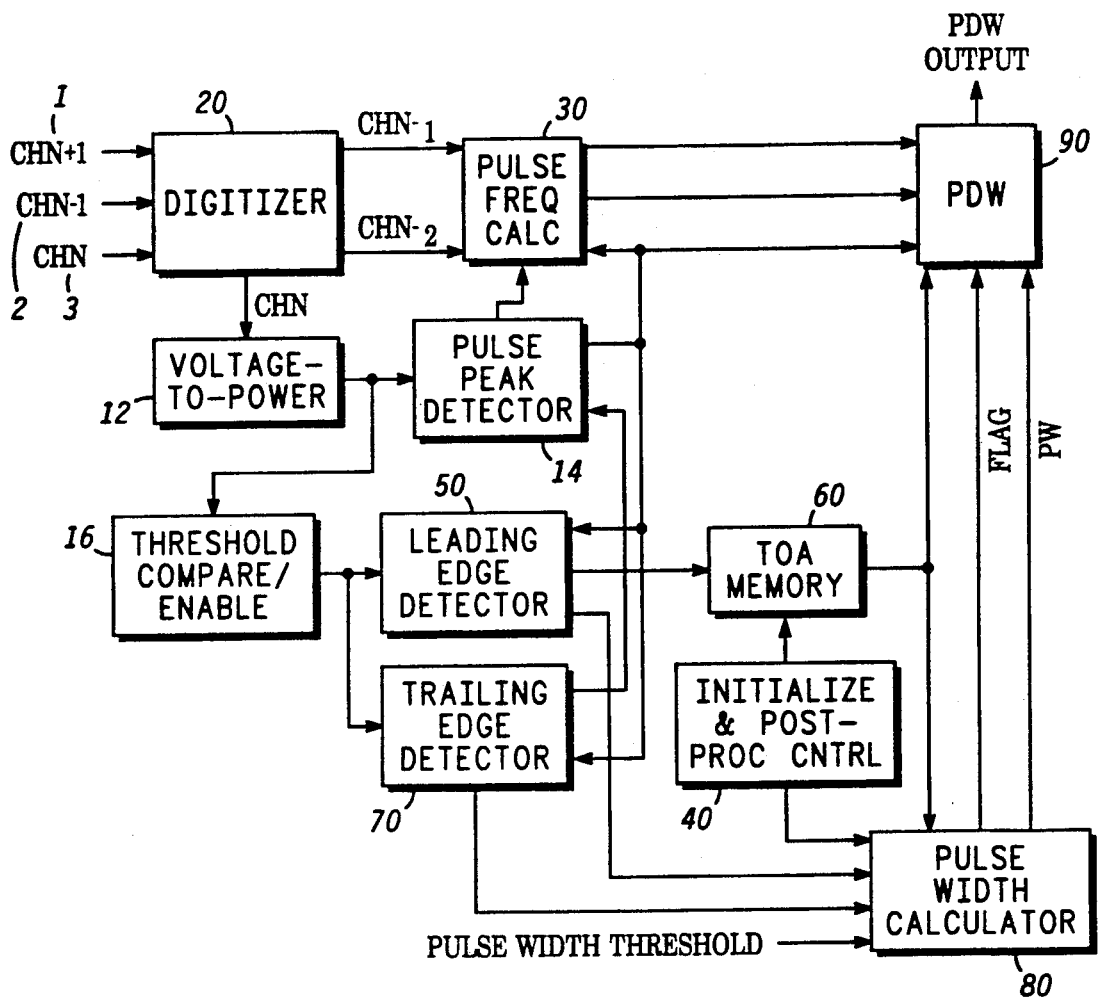
FIG. 1 is a schematic of a digital pulse processor according to the present invention.

FIG. 1 shows a block diagram of an advanced Digital Pulse Processor (DPP) 10 in its preferred embodiment. DPP 10 determines the time of arrival (TOA), frequency, amplitude, and pulse width of an input video signal. For purposes of explanation, DPP 10 of FIG. 1 supports a 13 MHz bandwidth, but the bandwidth may be varied for various applications.

Figure 2:
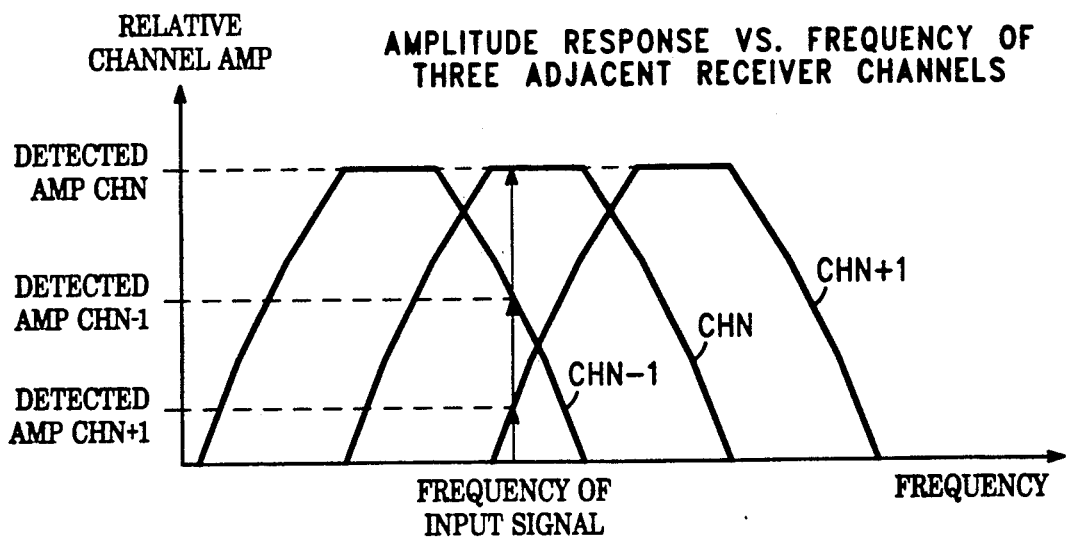
FIG. 2 is a diagram of video signals passing through three adjacent channels.

Three inputs, 1, 2, and 3, are received into DPP 10 by a digitizer 20. In DPP 10, input 3 represents the channel of interest for TOA, frequency, amplitude, and pulse width determination. An input video signal is shown in FIG. 2 as having a center frequency within the channel represented by input 3 in FIG. 1 and labeled CHN in FIGS. 1 and 2. Input 3 registers the amplitude of the video signal in the center channel. However, this does not represent the center of frequency of the video signal. A first adjacent channel labeled CHN+1 and represented by input 1 in FIG. 1 measures the amplitude of the incoming pulse on the skirt of the radio frequency (r.f.) band centered on CHN+1. A second adjacent channel labeled CHN−1 is represented by input 2 in FIG. 1. CHN−1 measures the amplitude of the incoming pulse on the skirt of the r.f. band centered on CHN−1. As described subsequently, the detected amplitude measurements of CHN+1 and CHN−1 (inputs 1 and 2) are used to make the frequency measurement of the video signal within CHN, or input 3.

Under normal operating conditions, multiple fundamental video signals, or signals received at the same time in adjacent channels, are not received by DPP 10. This is due to the low probability of independent signal sources producing pulses of identical frequency (or nearly identical frequency) at the same instant in time. However, there will be times when independent video signals (signals from separate sources) are simultaneously present in CHN and either or both CHN+1 and CHN−1. Having independent signals adjacent to CHN can cause distortion in the frequency measurement of the CHN video signal. Specifically, two amplitudes would be present in the adjacent channel receiving an additional video signal, and CHN would register a related skirt amplitude. Post processing of the signals (not described in this description of the present invention) is continually required to check for such coincidental signals. In real time, the signals are processed through DPP 10. Subsequently, checking occurs. In the post processing, differing signals are stored within a library of video signals output from DPP 10. As signals are output from DPP 10, the post process flags the outputs having coincidental signals in adjacent channels. The post process then compares the flagged outputs to amplitudes (and pulse width and/or TOA if necessary) stored within the post processing library. The post process next determines whether the signal data is corrupted or not. If it is corrupted, the signal is either discarded or reported without fine frequency data.

Figure 3:
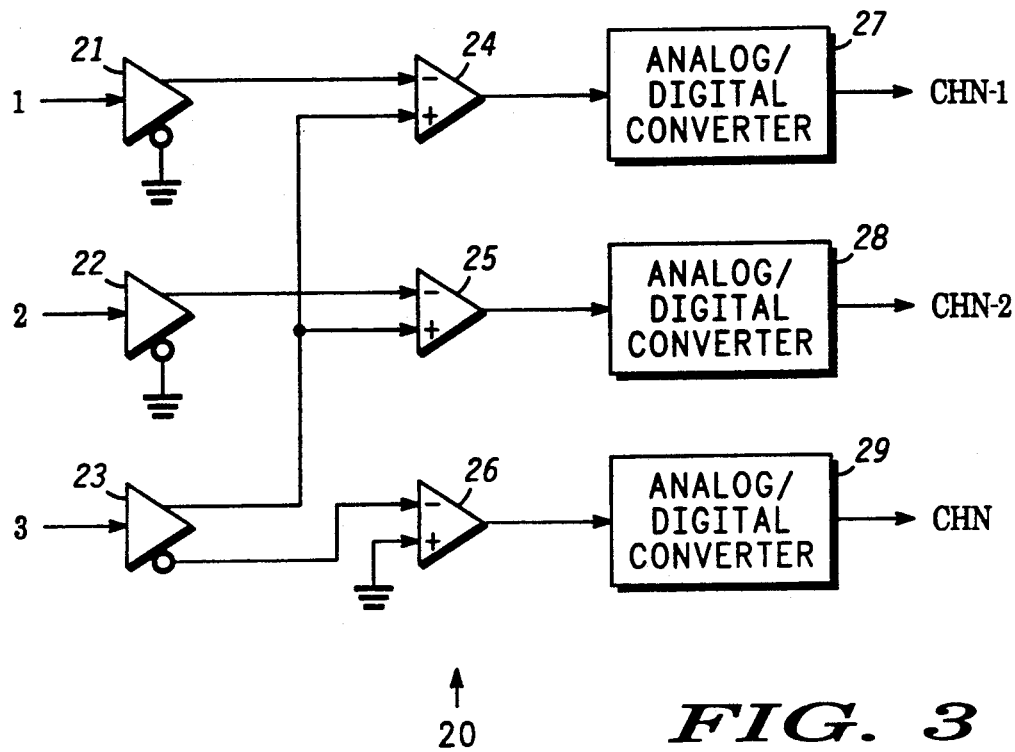
FIG. 3 is a schematic of a digitizer for the digital pulse processor according to the present invention.

Referring now to the digitizer 20 block diagram of FIG. 3, the input video signals 1 through 3 are buffered by distribution amplifiers 21 through 26. Amplifiers 21 and 22 receive inputs 1 and 2 and output to differencing amplifiers 24 and 25, respectively. Amplifier 23 receives input 3, and splits its output among amplifiers 24 through 26. Amplifiers 24 and 25 are differencing amplifiers, while amplifier 26 is a buffer amplifier. The differences in magnitude between input 1 and input 3, and input 2 and input 3, are determined in amplifiers 24 and 25 respectively. These differences are output to A/D (analog/digital) converters 27 and 28. The magnitude of input 3 is output by amplifier 26 to A/D converter 29. Using the set of buffering amplifiers 21 through 26 allows input 3 to be split to the differencing amplifiers while maintaining a proper alignment, in time, of analog signals arriving at A/D converters 27 through 29. Specifically, the amplifier paths buffering the video signals from inputs 1 and 2 support the 13 MHz video bandwidth while providing gain. The gain satisfies the A/D input signal range for A/D converters 27 and 28 with a peak pulse amplitude differential of 5 to 12 dB. Amplifier 26 is similar to amplifiers 24 and 25 to match the overall pulse amplitude range with the A/D input signal range. Amplifier 26 also maintains the alignment in time of the analog video signal of input 3 with the analog video signals of inputs 1 and 2. Each of A/D converters 27 through 29 are 8-bit devices operating at a sample rate of 100 Msps (mega samples per second). The digitized outputs from A/D converters 27 through 29 provide sufficient resolution to define the pulse amplitude within ±0.5 dB. The resolution also allows definition of the pulse frequency within ±100 kHz for pulse amplitudes greater than 150 mV at CHN input 3, assuming a channel spacing of 20 MHz.

The outputs of digitizer 20 are labeled CHN−1 for A/D converter 27 processing input 1, CHN−2 for A/D converter 28 processing input 2, and CHN for converter 29 processing input 3.

Referring again to FIG. 1, CHN is output from digitizer 20 to voltage-to-power circuit 12. Circuit 12 allows precise matching of CHN to the detector characteristic of input 3. The voltage-to-power conversion is accomplished by using four (4) identically programmed 256×8 ECL PROM look-up tables with digital outputs. The ECL PROMs are multiplexed and latched to support a 100 MHz sample rate within the access time limits of the devices. The output from circuit 12 is input to pulse peak detector 14 and threshold compare/enable 16.

Each sample from circuit 12 is compared in pulse peak detector 14 to a previous maximum value sample stored within pulse peak detector 14. The maximum value sample is continuously updated anytime a new sample exceeds the previously stored maximum. This process occurs until an end of pulse condition is signalled from trailing edge detector 70. Each time a new maximum value is stored, pulse peak detector 14 sends a signal to pulse frequency calculator 30 to store a new frequency measurement. This allows the reported frequency value to be measured at the point on the pulse with the highest signal to noise ratio (S/N), when the frequency measurement is the most accurate. Pulse peak detector 14 also sends the value of the peak pulse to leading edged detector 50 and trailing edge detector 70.

An externally provided threshold value is input into threshold compare/enable 16. This threshold value prevents processing of noise which occurs below an externally determined value. In threshold compare/enable 16, a decision to enable the edge detection circuitry is made when the input signal from voltage-to-power circuit 12 exceeds the threshold value. CHN is then sent to leading edge detector 50 and trailing edge detector 70 with an enable signal which starts the edge detecting process.

Figure 4:
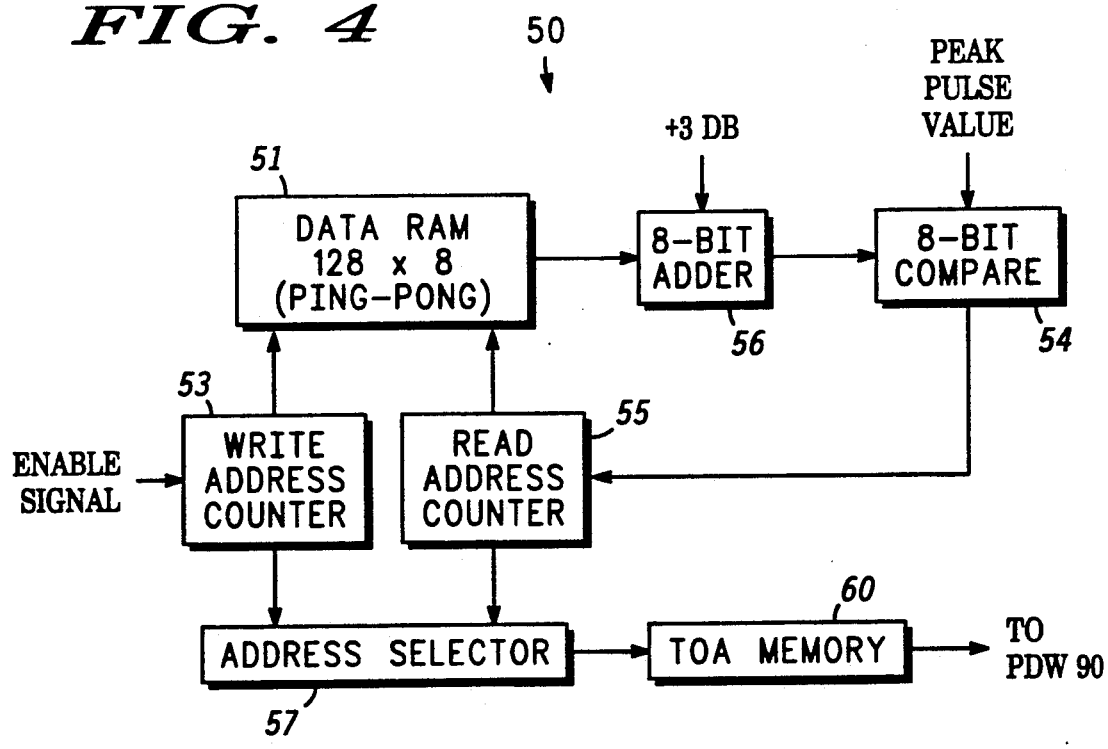
FIG. 4 is a schematic of a leading edge detector for the digital pulse processor according to the present invention.

Referring now to FIG. 4, leading edge detector 50 is shown in detail. CHN is input into a data RAM 51. A corresponding TOA time is stored in TOA memory 60 for each CHN sample after the external threshold of threshold compare/enable 16 has been exceeded. Both data RAM 51 and TOA memory 60 have sufficient memory depths needed for maintaining the history of the samples required to accommodate the longest rise time. In other words, enough samples are stored to define a sample 3 dB down the leading edge from the currently stored maximum CHN sample. Write address counter 53 provides the memory address for each sample from threshold compare/enable 16 to data RAM 51 and the corresponding TOA memory 60.

The peak pulse value from peak pulse detector 14 is entered into an 8-bit compare circuit 54 and updated with each successively larger amplitude sample. A control signal from 8-bit compare 54 is sent to read address counter 55. After each new sample has been stored, read address counter 55 accesses data RAM 51 in a location representing a sampled CHN occurring before the currently stored pulse peak. This causes the sampled CHN to be relayed to 8-bit adder 56. Eight-bit adder 56 adds three (3) dB to the relayed CHN, after which the summed CHN is compared in 8-bit compare 54 with the peak pulse value from peak pulse detector 14. If the pulse peak value in 8-bit compare 54 is less than the summed CHN from 8-bit adder 56, a control signal is sent to read address counter 55 to increment the read location by one (1). The next preceding sample in time before the time of the last stored pulse peak is then added. The loop involving read address counter 55, data RAM 51, 8-bit adder 56, and 8-bit compare 54 continues until the summed CHN from 8-bit adder 56 is less than the pulse peak value in 8-bit compare 54. This final sample read represents the first point on the leading edge of the video signal which has an amplitude that is greater than 3 dB below the pulse peak value. This determination is useful because the read address counter 55 value can be used to access the actual TOA for the pulse stored in TOA memory 60. Write Address Counter 53 is continually writing corresponding time samples to TOA memory 60 through an Address Selector 57 as data samples are written to Data RAM 51. Therefore, the location of the TOA for a specific CHN amplitude data point is easily found. Address Selector 57 instructs TOA memory 60 to output the TOA stored in the location corresponding to the first point TOA of the sampled CHN which is 3 dB below the pulse peak value. The TOA memory 60 then outputs the first point TOA of the sampled CHN to PDW 90 (shown in FIG. 1). This point is the TOA of the video signal.

In the preferred embodiment, the 100 MH$_z$ sample rate poses a problem for Data RAM 51. Both a read and a write operation must be performed within a ECL 128×4 RAM block in both data RAM 51 and TOA memory 60. Data RAM 51 is a ping-pong memory architecture to facilitate simultaneous read and write operations, and both RAMs 51 and TOA memory 60 have a seven (7) nS sample time.

Trailing edge detector 70 incorporates a similar architecture as leading edge detector 50 shown in FIG. 4, and uses the same "add 3 dB and compare" technique. Trailing edge detector 70 observes samples that have occurred after the pulse peak has been detected and stored. The final point for the trailing edge is determined within trailing edge detector 70 when the summed CHN is less than the pulse peak from pulse peak detector 14. Furthermore, the circuit corresponding to TOA memory 60 of leading edge detector 50 outputs the final point of the video signal used to calculate the total useful pulse width, and signals the end of processing on the current pulse.

Referring again to FIG. 1, pulse width calculator 80 receives the first point output of the leading edge from TOA memory 60, and the final point of the trailing edge from trailing edge detector 70. These two points define the width of the video signal pulse. Pulse width calculator 80 subtracts the first point TOA of the leading edge from the final point TOA from the trailing edge to achieve a value for the pulse width. This value is compared to an externally determined pulse width threshold. A flag is generated by pulse width calculator 80 and multiplexed into PDW (pulse descriptor words) 90, for all pulse width measurements that occur on pulses whose amplitude exceeds the externally provided threshold value.

Pulse frequency calculator 30 receives CHN−1 and CHN−2 from digitizer 20, a signal from pulse peak detector 14 when a peak is detected, and the pulse peak amplitude from pulse peak detector 14. Pulse frequency calculator 30 utilizes CHN−1 and CHN−2 to estimate a fine frequency offset in the arriving pulses.

Figure 5:
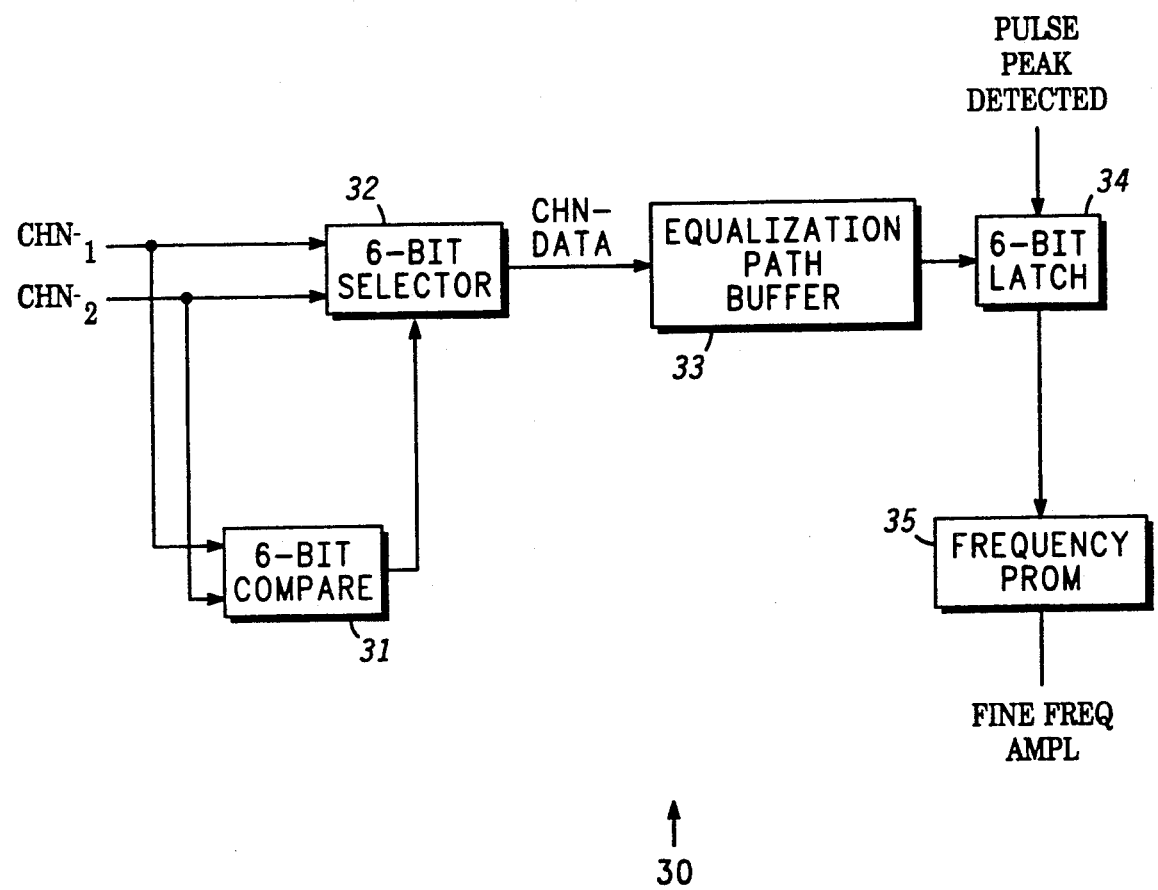
FIG. 5 is a schematic of a pulse frequency calculator for the digital pulse processor according to the present invention.

Pulse frequency calculator 30 is shown in detail in FIG. 5. CHN−1 and CHN−2 are both input into 6-bit compare 31 and 6-bit selector 32. Six-bit compare 31 determines which of CHN−1 and CHN−2 has the greater amplitude, and relays this information to 6-bit selector 32. Selecting the larger amplitude channel serves two functions. First, a fine frequency may be calculated from digitized values representing 0 dB (for 10 MH$_z$ offset) to up to 12 dB (for a 0 MH$_z$ frequency offset). Second, the selector control input represents a SIGN bit, indicating the direction of frequency offset for use in the computation of overall pulse frequency. Six-bit selector 32 relays only the channel having the greater amplitude to equalization path buffer 33 (represented by CHN-data). Buffer 33 delays the CHN-data in order to align the selected sample with a peak detect signal from pulse peak detector 14. When a pulse peak is detected, pulse peak detector 14 sends a detection signal to pulse frequency calculator 30 which is received in 6-bit latch 34. Six-bit latch 34 then allows the CHN-data stored in equalization path buffer 33 to pass on to a frequency PROM 35. Frequency PROM 35 also receives the peak pulse amplitude from pulse peak detector 14. The peak pulse amplitude and the CHN-data are used as determinants for the fine frequency conversion table in frequency PROM 35 for the video signals. In the preferred embodiment, a 4096×8 PROM is used.

The approach used in pulse frequency calculator 30 incorporates voltage-to-power conversion information into a single PROM tabulation. This replaces considerable high data rate hardware in each difference path with a single medium rate PROM look-up table. The access time of PROM 35 is required to be fast enough to allow PDW 90 sufficient time to perform frequency computations before the end of the post-processing time allotment. The frequency tabulated within PROM 35 is output to PDW 90.

PDW 90 in FIG. 1 combines the TOA from TOA memory 60, the pulse width from pulse width calculator 80, the pulse amplitude from pulse peak detector 14, and the frequency from pulse frequency calculator 30 into a 64-bit word. The 64-bit word is output in 16-bit word increments. The 16-bit word increments are the DPP 10 outputs. The data format could be customized to support any desired system interface.

The initialize and post-process control (IPPC) 40 provides overall mode control for DPP 10. IPPC 40 distributes initializing signals to TOA memory 60 and pulse width calculator 80, and supplies reset capabilities to all DPP 10 circuits at the conclusion of a pulse processing period and at power-up.

Through the architecture of DPP 10 as described above, frequency, amplitude, pulse width, and TOA of an input video signal is found in realtime. DPP 10 further uses approximately 160 watts of power and may be housed in a 14-inch by 24-inch drawer suitable for mounting in a standard 19-inch equipment rack. Thus the objectives of the present invention have been fulfilled through DPP 10.

Thus there has been provided, in accordance with the present invention, a digital pulse processor for precisely determining leading and trailing TOA, pulse width, amplitude, and frequency of a video signal that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A pulse parameter characterizer which receives a plurality of detected input signals and outputs pulse parameters of the signals to a data collection system, said characterizer comprising:

pulse peak detector receiving one of the plurality of detected input signals;

said pulse peak detector generating a peak amplitude timing strobe and a maximum pulse amplitude;

frequency determination means coupled to said pulse peak detector to receive said peak amplitude timing strobe from said pulse peak detector;

said frequency determination means receiving the plurality of detected input signals;

said frequency determination means for measuring a fine-tuned frequency from said peak amplitude timing strobe and the plurality of detected input signals;

reference point locator means receiving said one of the plurality of detected input signals;

said reference point locator means for determining a time-of-arrival (TOA) and a pulse width of the input signals;

said maximum pulse amplitude, said fine-tuned frequency, said TOA, and said pulse width characterizing said pulse parameters; and output means coupled to said reference point locator means for outputting said pulse parameters to said data collection system.

2. A pulse parameter characterizer according to claim 1 wherein the characterizer further comprises:

said output means for generating a digital output word from said maximum pulse amplitude, said fine frequency, said TOA, and said pulse width;

said output means coupled to said frequency determination means to receive said fine-tuned frequency; and said output means coupled to said pulse peak detector to receive said maximum pulse amplitude.

3. A pulse parameter characterizer according to claim 1 wherein said reference point locator means comprises:

edge detector means coupled to said pulse peak detector to receive said maximum pulse amplitude; and said edge detector means for determining an amplitude value for a point for each of the leading and trailing edges of said one of the plurality of detected input signals, said point for each being a predetermined decibel (dB) level below said maximum pulse amplitude.

4. A pulse parameter characterizer according to claim 3 wherein said reference point locator means further comprises:

calculator means coupled to said edge detector means;

said calculator means for determining a pulse width from sampling times relating to said amplitude values.

5. A pulse parameter characterizer according to claim 3 wherein said edge detector means comprises a leading edge detector and a trailing edge detector.

6. A pulse parameter characterizer according to claim 5 wherein said leading edge detector comprises:

random access memory (RAM) means receiving said one of the detected input signals;

adder means coupled to said RAM means to retrieve said one of the detected input signals;

said RAM means for storing sequential samples of points along said one of the detected input signals for access by said adder means;

said adder means for adding a predetermined dB value to each of said sequential samples of points received from said RAM means to generate an adder output, said predetermined dB value corresponding to said predetermined dB level;

compare means coupled to said adder means to receive said adder output, and coupled to said pulse peak detector to receive said maximum pulse amplitude;

said compare means for comparing said adder output to said maximum pulse amplitude to determine if said adder output equals said maximum pulse amplitude;

said compare means coupled to said RAM means to output a next read signal when a subsequent sample is to be processed;

said RAM means outputting each of said sequential samples of points until said adder output equals said maximum pulse amplitude in said compare means;

said RAM means outputting one of said sequential samples of points, said one of said sequential samples of points corresponding to an adder output which equals said maximum pulse amplitude;

output means coupled to said RAM means to receive said one of said sequential samples of points; and said output means outputting said one of said sequential samples of points to a TOA memory as said TOA.

7. A pulse parameter characterizer according to claim 1 wherein said frequency determination means comprises:

compare means receiving the plurality of detected input signals;

said compare means comparing each of the plurality of detected input signals, except said one detected input signal of the plurality of detected input signals of said pulse peak detector, to determine which of the residual of the plurality of detected input signals is greater in amplitude;

selector means receiving said residual of the plurality of detected input signals;

said selector means coupled to said compare means to receive a signal designating which of the amplitudes of said residual of the plurality of detected input signals is greater;

said selector means selecting the one of said residual of the plurality of detected input signals which has the greater amplitude value;

latch coupled to said selector means to receive said greater of said residual of the plurality of detected input signals, and further coupled to said pulse peak detector to receive said peak amplitude timing strobe;

frequency processor means coupled to said latch;

said latch relaying said greater of said residual of the plurality of detected input signals to said frequency processor means when said peak amplitude timing strobe is received by said latch;

said frequency processor means coupled to said pulse peak detector to receive said greater of said residual of the plurality of detected input signals;

said frequency processor means for tabulating said fine-tuned frequency from said greater of said residual of the plurality of detected input signals and from said one of the plurality of detected input signals; and said frequency processor means outputting said fine-tuned frequency.

8. A pulse parameter characterizer according to claim 1 wherein the characterizer further comprises:
digitizer means coupled to said pulse peak detector, said digitizer coupled to said frequency determination means, and said digitizer coupled to said reference point locator means;
said digitizer means receiving the plurality of detected input signals in analog form; and
said digitizer means outputting the plurality of detected input signals in digital form.

9. A leading edge detector which receives sampled points of a detected input signal and a maximum pulse amplitude input related to the detected input signal, the detector comprising:
random access memory (RAM) means receiving the sampled points;
adder means coupled to said RAM means to retrieve the sampled points;
said RAM means for storing the sampled points for access by said adder means;
said adder means for adding a predetermined dB (decibel) value to each of the sampled points received from said RAM means to generate an adder output;
compare means coupled to said adder means to receive said adder output, and receiving the maximum pulse amplitude;
said compare means for comparing said adder output to the maximum pulse amplitude to determine if said adder output to the maximum pulse amplitude to determine if said adder output equals or exceeds the maximum pulse amplitude;
said compare means coupled to said RAM means to output a next read signal when a subsequent sample is to be processed;
said RAM means outputting each of the sampled points to said adder means until said adder output equals or exceeds said maximum pulse amplitude in said compare means;
said compare means outputting an address signal corresponding to one of the sampled points wherein said adder output equals or exceeds said maximum pulse amplitude;
output means coupled to said compare means to receive said address signal; and
said output means for using said address signal to access time-of-arrival information.

10. A frequency determinator which receives a plurality of detected input signals, one of which represents a peak amplitude, and the others representing reference frequency signals, and the frequency determinator further receiving a peak amplitude timing strobe representing a sample point of the peak amplitude and the frequency determinator outputting a fine-tuned frequency, the determinator comprising:
compare means receiving the reference frequency signals;
said compare means comparing each of the reference frequency signals to determine which of the reference frequency signals is greater in amplitude;
selector means receiving the reference frequency signals;
said selector means coupled to said compare means to receive a signal designating which of the amplitudes of the reference frequency signals is greater;
said selector means selecting the one of the reference frequency signals which has the greater amplitude value;
latch coupled to said selector means to receive said greater of the reference frequency signals;
said latch receiving the peak amplitude timing strobe;
frequency processor means coupled to said latch;
said frequency processor means receiving the peak amplitude;
said latch relaying said greater of the reference frequency signals to frequency processor means when the peak amplitude timing strobe is received by said latch;
said frequency processor means for tabulating a fine-tuned frequency from said greater of the reference frequency signals and from the peak amplitude; and
said frequency processor means outputting the fine-tuned frequency.

11. A method for determining in parallel the pulse parameters of an input signal having accompanying reference frequency signals, the method comprising the steps of:
inputting the input signal to a pulse peak detector;
sampling the input signal until a peak amplitude is detected, and generating a peak amplitude timing strobe;
inputting the input signal to a reference point locator;
determining within said reference point locator a leading edge and a trailing edge of the input signal and calculating a pulse width value from said leading edge and trailing edge, said leading edge representing a time-of-arrival (TOA);
inputting the reference frequency signals to a frequency calculator;
inputting said peak amplitude timing strobe to said frequency calculator, and inputting said peak amplitude to said frequency calculator;
tabulating a fine-tuned frequency from the reference frequency signals and said peak amplitude; and
outputting said fine-tuned frequency, said peak amplitude, said pulse width value, and said TOA as the parameters of the frequency of interest signal.

12. A method for determining in parallel the pulse parameters of an input signal according to claim 11 wherein said step of tabulating a fine-tuned frequency comprises the steps of:
determining which of the reference frequency signals has the greater amplitude;
relaying said reference frequency signals having the greater amplitude to a latch;
relaying said reference frequency signal having the greater amplitude to a frequency calculator;
inputting the frequency of interest signal to said frequency calculator;
tabulating said fine-tuned frequency from the frequency of interest signal and from said reference frequency signal having the greater amplitude; and
outputting said fine-tuned frequency.

13. A method for determining in parallel the pulse parameters of an input signal according to claim 11 wherein said step of determining within said reference point locator a leading edge comprises the steps of:
writing sample points of the frequency of interest signal to a random access memory (RAM);
sequentially supplying said sample points to an adder;

adding within said adder a predetermined decibel (dB) value to each of said sequentially supplied sample points;

receiving said peak amplitude withina a calculator;

comparing each of said added sample points with said peak amplitude within said calculator and generating a next sample point signal when said added sample point is less than said peak amplitude;

continuing said steps of sequentially supplying said sample points through comparing each of said added sample point until said added sample point is equal to or greater than said peak amplitude; and outputting the current sampled point when said added sample point is equal to or greater than said peak amplitude.

14. A method for determining in parallel the pulse parameters of an input signal according to claim 11 wherein the method further comprises the step of combining said fine-tuned frequency, said pulse width value, said TOA, and said peak amplitude into a pulse parameter word.

* * * * *

UNITED STATES PATENT AND TRADEMARK OFFICE
CERTIFICATE OF CORRECTION

PATENT NO. : 5,121,413
DATED : June 9, 1992
INVENTOR(S) : Carl H. Voegtly et al.

It is certified that error appears in the above-identified patent and that said Letters Patent is hereby corrected as shown below:

In column 9, claim 9, lines 35 and 36, delete the repeated phrase "to the maximum pulse amplitude to determine if said adder output".

Signed and Sealed this

Twenty-second Day of June, 1993

Attest:

MICHAEL K. KIRK

Attesting Officer

Acting Commissioner of Patents and Trademarks